United States Patent
Cho et al.

(10) Patent No.: US 10,158,074 B2
(45) Date of Patent: Dec. 18, 2018

(54) ORGANIC LAYER DEPOSITION ASSEMBLY, ORGANIC LAYER DEPOSITION DEVICE INCLUDING THE SAME, AND METHOD OF MANUFACTURING ORGANIC LIGHT-EMITTING DISPLAY DEVICE USING THE ORGANIC LAYER DEPOSITION ASSEMBLY

(71) Applicant: Samsung Display Co., Ltd., Yongin-si (KR)

(72) Inventors: Youngsun Cho, Yongin-si (KR); Daeyong Kim, Yongin-si (KR); Jongbum Kim, Yongin-si (KR); Jongho Yang, Yongin-si (KR); Yoonchan Oh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/390,908

(22) Filed: Dec. 27, 2016

(65) Prior Publication Data

US 2017/0186954 A1      Jun. 29, 2017

(30) Foreign Application Priority Data

Dec. 24, 2015   (KR) ................... 10-2015-0186769

(51) Int. Cl.
*H01L 51/56*  (2006.01)
*H01L 51/00*  (2006.01)
(Continued)

(52) U.S. Cl.
CPC .......... *H01L 51/0011* (2013.01); *B05B 12/22* (2018.02); *B05D 1/32* (2013.01);
(Continued)

(58) Field of Classification Search
CPC ..... H01L 51/0011; H01L 51/56; H01L 51/50; B05B 15/0443; B05B 15/045; B05B 9/01;
(Continued)

(56) References Cited

U.S. PATENT DOCUMENTS

| 8,968,829 B2 | 3/2015 | Ryu et al. |
| 9,040,330 B2 | 5/2015 | Choi et al. |

(Continued)

FOREIGN PATENT DOCUMENTS

| KR | 10-2011-0021623 | 3/2011 |
| KR | 10-2014-0018046 | 2/2014 |

(Continued)

*Primary Examiner* — Michael Trinh
(74) *Attorney, Agent, or Firm* — H.C. Park & Associates, PLC

(57) ABSTRACT

An organic layer deposition assembly for depositing a deposition material on a substrate includes a deposition source configured to spray the deposition material, a deposition source nozzle arranged in one side of the deposition source and including deposition source nozzles arranged in a first direction, a patterning slit sheet arranged to face the deposition source nozzle and having patterning slits in a second direction that crosses the first direction, and a correction sheet arranged between the deposition source nozzle and the patterning slit sheet and configured to block at least a part of the deposition material sprayed from the deposition source.

5 Claims, 10 Drawing Sheets

(51) Int. Cl.
  *B05D 1/00* (2006.01)
  *B05D 1/32* (2006.01)
  *C23C 14/04* (2006.01)
  *B05B 12/22* (2018.01)
  *B05B 12/36* (2018.01)

(52) U.S. Cl.
  CPC .............. *B05D 1/60* (2013.01); *C23C 14/042* (2013.01); *H01L 51/56* (2013.01); *B05B 12/36* (2018.02)

(58) Field of Classification Search
  CPC ........... B05B 12/22; B05B 12/36; B05D 1/32; B05D 1/60; C23C 14/044; C23C 14/042
  See application file for complete search history.

(56) References Cited

U.S. PATENT DOCUMENTS

| | | | |
|---|---|---|---|
| 9,196,833 | B2 | 11/2015 | Chung et al. |
| 2012/0301614 | A1* | 11/2012 | Choi .................... C23C 14/042 |
| | | | 427/255.5 |
| 2014/0034917 | A1 | 2/2014 | Lee et al. |
| 2014/0312318 | A1* | 10/2014 | Choi .................. H01L 27/3272 |
| | | | 257/40 |
| 2016/0155944 | A1* | 6/2016 | Isomura ............. H01L 51/0011 |
| | | | 438/99 |

FOREIGN PATENT DOCUMENTS

| | | |
|---|---|---|
| KR | 10-2014-0125180 | 10/2014 |
| KR | 10-2014-0142626 | 12/2014 |

\* cited by examiner

ORGANIC LAYER DEPOSITION ASSEMBLY, ORGANIC LAYER DEPOSITION DEVICE INCLUDING THE SAME, AND METHOD OF MANUFACTURING ORGANIC LIGHT-EMITTING DISPLAY DEVICE USING THE ORGANIC LAYER DEPOSITION ASSEMBLY

CROSS-REFERENCE TO RELATED APPLICATION

This application claims priority from and the benefit of Korean Patent Application No. 10-2015-0186769, filed on Dec. 24, 2015, which is hereby incorporated by reference for all purposes as if fully set forth herein.

BACKGROUND

Field

Exemplary embodiments relate to an organic layer deposition assembly, an organic layer deposition device including the same, and a method of manufacturing an organic light-emitting display device using the same.

Discussion of the Background

Among display devices, an organic light-emitting display device has been in the spotlight as a next generation display device for its wide viewing angle, excellent contrast, and fast response time.

The organic light-emitting device includes a first electrode, a second electrode opposite the first electrode, and an intermediate layer disposed between the first electrode and the second electrode and including an emission layer. The first electrode, the second electrode, and the intermediate layer are formed by using various methods. One of these various methods is an independent deposition method. In order to manufacture the organic light-emitting display device by using a deposition method, an organic layer of a predetermined pattern is formed by bringing a fine metal mask (FMM) having the same pattern as the pattern of the organic layer or the like into close contact with a substrate over which the organic layer or the like is to be formed and depositing a material of the organic layer or the like.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments include an organic layer deposition assembly, an organic layer deposition device including the same, and a method of manufacturing an organic light-emitting display device using the same.

Additional aspects will be set forth in part in the description which follows and, in part, will be apparent from the disclosure, or may be learned by practice of the inventive concept.

According to one or more exemplary embodiments, an organic layer deposition assembly for depositing a deposition material on a substrate includes a deposition source configured to spray the deposition material, a deposition source nozzle arranged in one side of the deposition source and including deposition source nozzles arranged in a first direction, a patterning slit sheet arranged to face the deposition source nozzle and having patterning slits in a second direction that crosses the first direction, and a correction sheet arranged between the deposition source nozzle and the patterning slit sheet and configured to block at least a part of the deposition material sprayed from the deposition source, wherein the organic layer deposition assembly is configured to perform deposition while the substrate moves in the first direction with respect to the organic layer deposition assembly, wherein the patterning slits include a first patterning slit and a second patterning slit spaced apart from each other by a predetermined distance in the first direction and in the second direction, and wherein a line crossing a center of the first patterning slit in the second direction and a line crossing a center of the second patterning slit in the second direction are spaced apart from each other by a predetermined distance.

According to one or more exemplary embodiments, an organic layer deposition device includes a transfer unit including a moving unit arranged to move along with a substrate fixed to the moving unit, a first transfer unit configured to transfer the moving unit to which the substrate is fixed in a first direction, and a second transfer unit configured to transfer the moving unit from which the substrate is separated when deposition is completed in a direction opposite the first direction, a loading unit configured to fix the substrate to the moving unit, a deposition unit including a chamber configured to maintain a vacuum therein and at least one organic layer deposition assembly configured to deposit an organic layer on the substrate fixed to the moving unit transferred from the loading unit, and an unloading unit configured to separate the substrate on which deposition is completed by passing through the deposition unit from the moving unit, wherein the moving unit is configured to move cyclically between the first transfer unit and the second transfer unit, wherein the substrate fixed to the moving unit is spaced apart from the organic layer deposition assembly by a predetermined degree while the first transfer unit is moving. The organic layer deposition assembly includes a deposition source configured to spray the deposition material, a deposition source nozzle arranged in one side of the deposition source and including deposition source nozzles arranged in a first direction, a patterning slit sheet arranged to face the deposition source nozzle and including patterning slits in a second direction crossing the first direction, and a correction sheet arranged between the deposition source nozzle and the patterning slit sheet and configured to block at least a part of the deposition material sprayed from the deposition source, wherein the organic layer deposition assembly is configured to perform deposition while the substrate moves in the first direction with respect to the organic layer deposition assembly, wherein the patterning slits include a first patterning slit and a second patterning slit spaced apart from each other by a predetermined distance in the first direction and in the second direction, and wherein a line crossing a center of the first patterning slit in the second direction and a line crossing a center of the second patterning slit in the second direction are spaced apart from each other by a predetermined distance.

According to one or more exemplary embodiments, a method of manufacturing an organic light emitting display device including an organic layer deposition device for depositing an organic layer on a substrate includes fixing the substrate to a moving unit wherein the fixing is performed by a loading unit, transferring the moving unit to which the substrate is fixed to a chamber via a first transfer unit installed to penetrate the chamber, forming the organic layer by depositing a deposition material sprayed from the organic layer deposition assembly on the substrate while the substrate relatively moves with respect to the organic layer deposition assembly wherein an organic layer deposition assembly and the substrate that are arranged in the chamber are spaced apart from each other by a predetermined degree, separating the substrate from which deposition is completed from the moving unit wherein the separating is performed by an unloading unit, and transferring the moving unit separated from the substrate to the loading unit via a second transfer unit installed to penetrate the chamber. The organic layer deposition assembly includes a deposition source configured to spray the deposition material, a deposition source nozzle arranged in one side of the deposition source and including deposition source nozzles arranged in a first direction, a patterning slit sheet arranged to face the deposition source nozzle and including patterning slits in a second direction that crosses the first direction, and a correction sheet arranged between the deposition source nozzle and the patterning slit sheet and configured to block at least a part of the deposition material sprayed from the deposition source wherein the organic layer deposition assembly is configured to perform deposition while the substrate moves in the first direction with respect to the organic layer deposition assembly, wherein the patterning slits include a first patterning slit and a second patterning slit spaced apart from each other by a predetermined distance in the first direction and in the second direction, and wherein a line crossing a center of the first patterning slit in the second direction and a line crossing a center of the second patterning slit in the second direction are spaced apart from each other by a predetermined distance.

According to one or more exemplary embodiments, an organic layer deposition assembly for depositing a deposition material on a substrate includes a deposition source, deposition source nozzles, a patterning slit, and a correction sheet. The deposition source nozzles are disposed in one side of the deposition source and are arranged in a first direction. The patterning slit sheet is arranged to face the deposition source nozzle and has patterning slits disposed in a second direction that crosses the first direction. The correction sheet is arranged between the deposition source nozzle and the patterning slit sheet, and is configured to block at least a part of the patterning slit sheet. The correction sheet is further shaped to block a larger portion of central patterning slits than peripheral patterning slits.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

Figure 1:
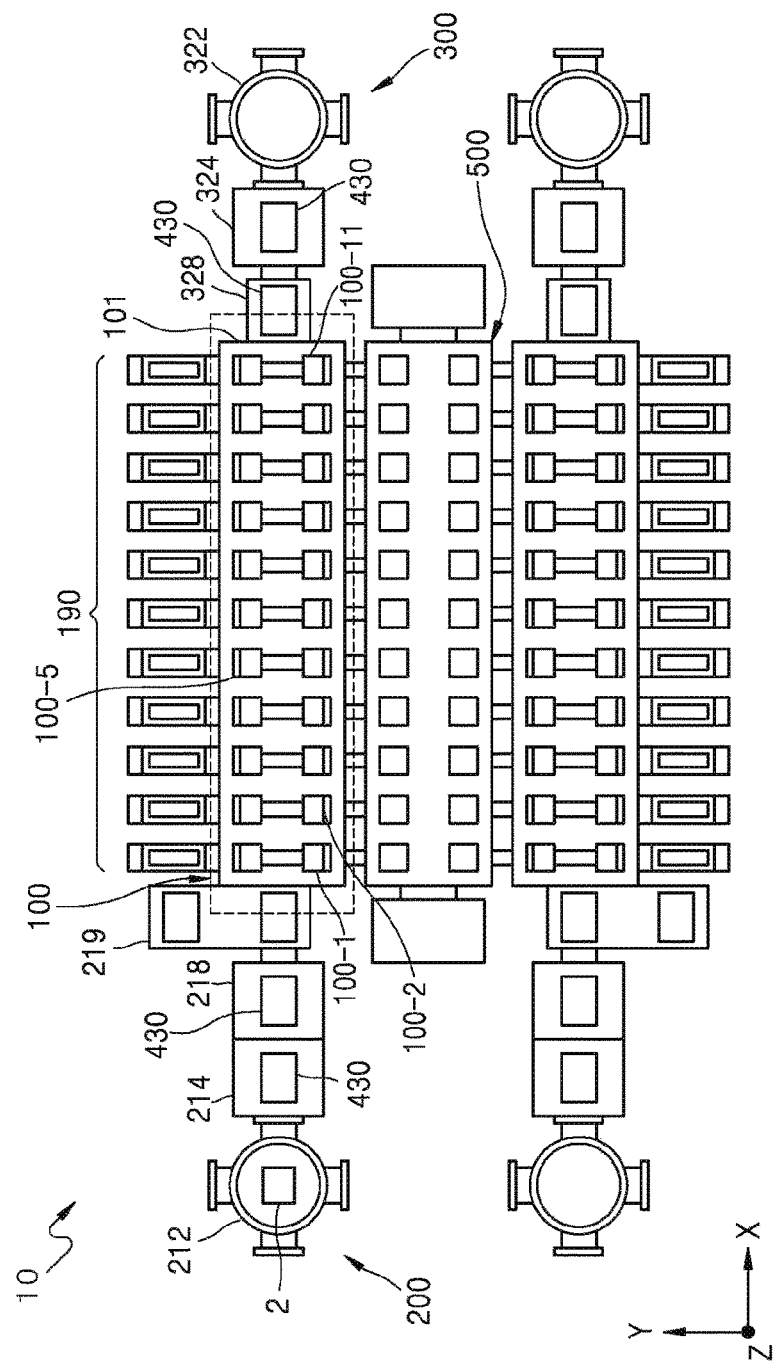
FIG. 1 is a schematic plan view of an organic layer deposition device according to an exemplary embodiment.

DETAILED DESCRIPTION OF THE ILLUSTRATED EMBODIMENTS the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
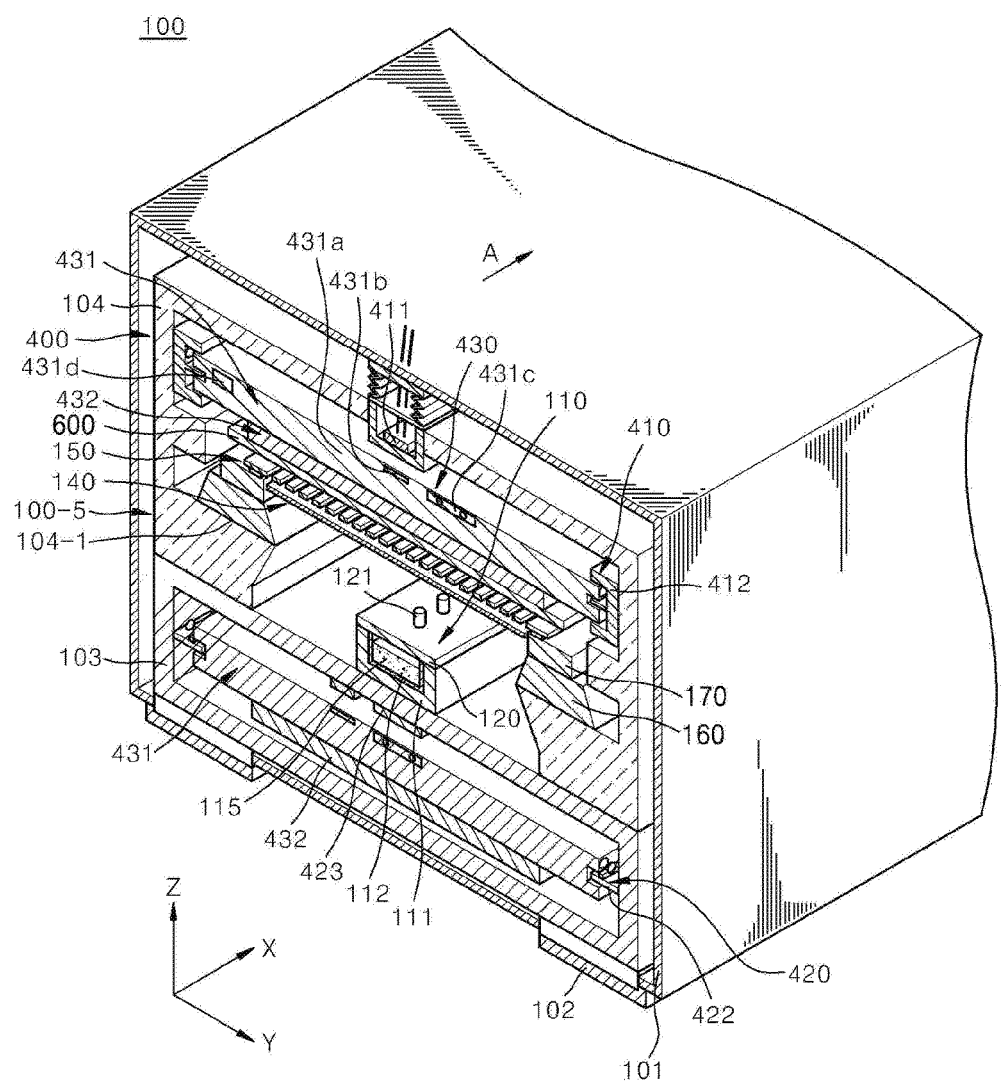
FIG. 2 is a schematic perspective cross-sectional view of a part of a deposition unit of the organic layer deposition device shown in FIG. 1.
Figure 3:
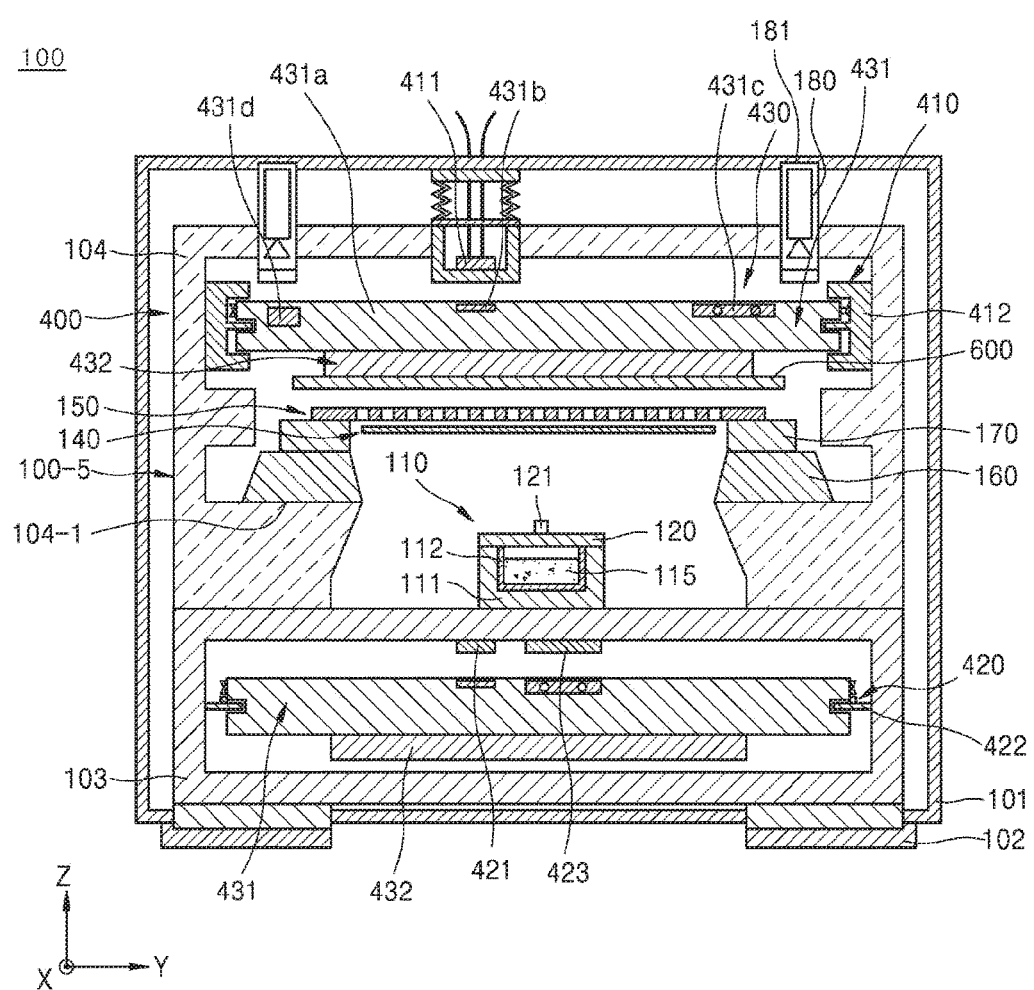
FIG. 3 is a schematic cross-sectional view of a part of the deposition unit of the organic layer deposition device shown in FIG. 1.

FIG. 1 is a schematic plan view of an organic layer deposition device 10 according to an exemplary embodiment. FIG. 2 is a schematic perspective cross-sectional view of a part of a deposition unit 100 of the organic layer deposition device 10 shown in FIG. 1. FIG. 3 is a schematic cross-sectional view of a part of the deposition unit 100 of the organic layer deposition device 10 shown in FIG. 1.

Referring to FIGS. 1, 2, and 3, the organic layer deposition device 10 may include the deposition unit 100, a loading unit 200, an unloading unit 300, and a transfer unit 400.

The loading unit 200 may include a first rack 212, an introduction chamber 214, a first inversion chamber 218, and a buffer chamber 219.

One or more substrates 600, over which deposition is to be performed, may be loaded over the first rack 212. An introduction robot provided in the introduction chamber 214 may hold the substrate 600 over the first rack 212, may place the substrate 600 over a moving unit 430 moved from a second transfer unit 420, and may move, to the first inversion chamber 218, the moving unit 430 over which the substrate 600 is placed.

The first inversion chamber 218 may be provided adjacent to the introduction chamber 214. A first inversion robot located in the first inversion chamber 218 may invert the moving unit 430 and may mount the moving unit 430 over a first transfer unit 410 of the deposition unit 100.

Referring to FIG. 1, the introduction robot of the introduction chamber 214 may place the substrate 600 over an upper surface of the moving unit 430. In this state, the moving unit 430 may be transferred to the inversion chamber 218. As the first inversion robot of the inversion chamber 218 may invert the inversion chamber 218, the substrate 600 may be turned upside down in the deposition unit 100.

A configuration of the unloading unit 300 may be opposite to that of the loading unit 200 described above. That is, a second inversion robot may invert the substrate 600 and the moving unit 430 which pass through the deposition unit 100 and may transfer the substrate 600 and the moving unit 430 to an ejection chamber 324. An ejection robot may eject the substrate 600 and the moving unit 430 from the ejection chamber 324, may separate the substrate 600 from the moving unit 430, and may load the separated substrate 600 over a second rack 322. The moving unit 430, separated from the substrate 600, may be retransferred to the loading unit 200 through the second transfer unit 420.

However, exemplary embodiments of the disclosure are not necessarily limited thereto. Thus, the substrate 600 may be directly transferred to the deposition unit 100 by being fixed to a lower surface of the moving unit 430. In this case, for example, the first inversion robot of the first inversion chamber 218 and the second inversion robot of the second inversion chamber 328 may be unnecessary.

The deposition unit 100 may include at least one chamber 101 for deposition. According to the exemplary embodiment shown in FIGS. 1 and 2, the deposition unit 100 may include the chamber 101 in which a plurality of deposition assemblies 100-1, 100-2, . . . 100-n may be arranged. According to the exemplary embodiment shown in FIG. 1, although the first through eleventh deposition assemblies 100-1 through 100-11 are installed in the chamber 101, the number of the deposition assemblies may vary according to a deposition material and a deposition condition. The chamber 101 may maintain a vacuum during deposition.

According to the exemplary embodiment shown in FIG. 1, the moving unit 430, to which the substrate 600 is fixed, may be moved to at least the deposition unit 100 by the transfer unit 410 or may be sequentially moved to the loading unit 200, the deposition unit 100, and the unloading unit 300 by the first transfer unit 410. The moving unit 430, separated from the substrate 600 in the unloading unit 300, may be retransferred to the loading unit 200 by the second transfer unit 420.

The first transfer unit 410 may penetrate the chamber 101 when passing through the deposition unit 100. The second transfer unit 420 may transfer the moving unit 430 from which the substrate 600 is separated.

In the organic layer deposition device 10 according to the present exemplary embodiment, the first and second transfer units 410 and 420 may be respectively arranged in a vertical direction so that the moving unit 430, that completes deposition while passing through the first transfer unit 410, is separated from the substrate 600 in the unloading unit 300 and retransferred to the loading unit 200 through the second transfer unit 420 arranged below the moving unit 430. Thus, space utilization efficiency in the organic layer deposition device 10 may be improved.

The deposition unit 100 of FIG. 1 may further include a deposition source replacement unit 190 at one side of each of the deposition assemblies 100-1 through 100-*n* (where n is a natural number from 1 through n, with n being 11 in the present exemplary embodiment). Although not shown in detail in FIG. 1, the deposition source replacement unit 190 may be formed in a cassette type so as to be ejected to the outside from each of the deposition assemblies 100-1 through 100-*n* (where n is a natural number from 1 through 11). Thus, a deposition source (see 110 of FIG. 3) of the organic layer deposition assembly 100-5 may be easily replaced.

Figure 4:
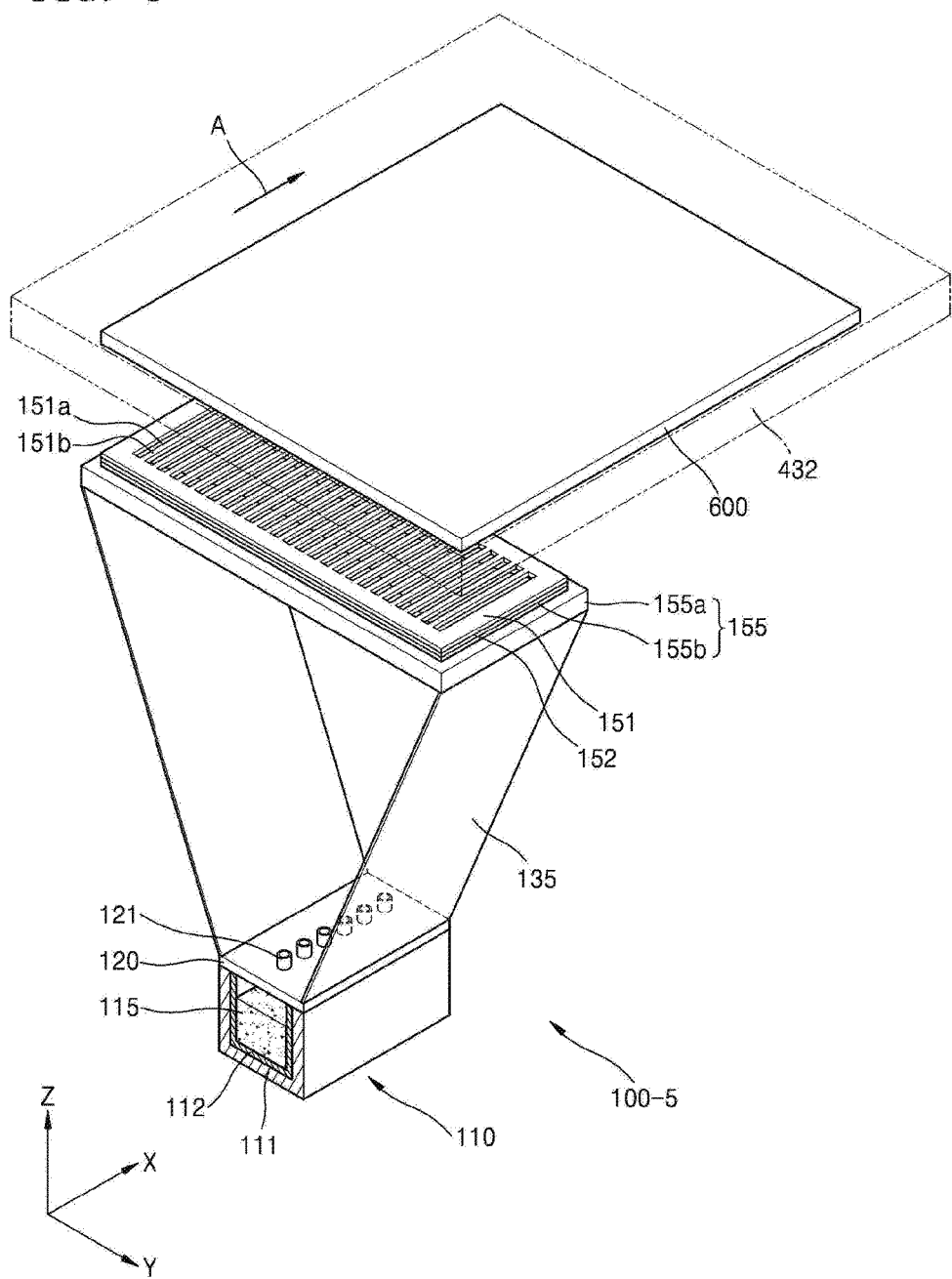
FIG. 4 is a schematic perspective view of an organic layer deposition assembly according to an exemplary embodiment.

As shown in FIG. 1, two sets are provided in parallel for constituting the organic layer deposition device 10, each including the loading unit 200, the deposition unit 100, the unloading unit 300, and the transfer unit 400 (shown in FIG. 4). That is, two organic layer deposition devices 10 may be respectively provided at an upper side and a lower side in FIG. 1.

In this case, a patterning slit sheet replacement unit 500 may be further disposed between the two organic layer deposition devices 10. That is, the patterning slit sheet replacement unit 500 may be disposed between the two organic layer deposition devices 10 such that the two organic layer deposition devices 10 share the patterning slit sheet replacement unit 500, thereby improving space utilization efficiency, compared to a case where each of the two organic layer deposition devices 10 includes the patterning slit sheet replacement unit 500.

Referring to FIGS. 2 and 3, the deposition unit 100 of the organic layer deposition device 10 may include at least one organic layer deposition assembly 100-5 and the transfer unit 400.

An overall configuration of the deposition unit 100 will be described below.

The chamber 101 may be formed as a hollow box shape. The at least one organic layer deposition assembly 100-5 and the transfer unit 400 may be accommodated in the chamber 101. In more detail, a base 102 may be formed and fixed to a support surface (such as a floor), a lower housing 103 may be formed over the base 102, and an upper housing 104 may be formed over the lower housing 103. The chamber 101 may accommodate both of the lower and upper housings 103 and 104 therein. In this regard, a connector between the lower housing 103 and the upper housing 104 may be sealed to allow an inside of the chamber 101 to be entirely blocked from the outside.

As described above, the lower and upper housings 103 and 104 may be arranged over the base 102 fixed to the support surface, and thus the lower and upper housings 103 and 104 may maintain their fixed positions even though the chamber 101 repeatedly contracts or expands. Accordingly, the lower and upper housings 103 and 104 may function as a kind of a reference frame in the deposition unit 100.

The organic layer deposition assembly 100-5 and the first transfer unit 410 of the transfer unit 400 may be arranged in the upper housing 104, and the second transfer unit 420 of the transfer unit 400 may be arranged in the lower housing 103. Deposition may be continuously performed while the moving unit 430 cyclically moves between the first transfer unit 410 and the second transfer unit 420.

A detailed configuration of the organic layer deposition assembly 100-5 will be described below.

The organic layer deposition assembly 100-5 may include a deposition source 110, a deposition source nozzle 120, source shutters 140, a frame sheet assembly 150, a first stage 160, and a second stage 170. In order to ensure that a deposition material 115 is delivered in a linear manner, all elements of FIGS. 2 and 3 may be arranged in the chamber 101 in which an appropriate degree of vacuum is maintained.

The substrate 600, that is, a deposition target, may be arranged in the chamber 101. The substrate 600 may be a substrate for a flat panel display device. The substrate 600 may also be a large-sized substrate for manufacturing a flat panel display device having a large screen of about 40 inches or more.

In this regard, deposition may be performed while the substrate 600 moves relatively with respect to the organic layer deposition assembly 100-5.

In more detail, it is required that a fine metal mask (FMM) has the same size as that of a substrate in the exiting FMM deposition method. Thus, if the size of the substrate increases, an FMM with a larger size is required. Accordingly, it is not easy to manufacture an FMM and also it is not easy to manufacture an FMM having tensile properties and align the FMM in a precise pattern.

In order to address these problems, deposition may be performed while the organic layer deposition assembly 100-5 and the substrate 600 move relatively with respect to each other. In other words, deposition may be continuously performed while the substrate 600 facing the organic layer deposition assembly 100-5 moves in an X-axis direction. That is, deposition may be performed in a scanning manner while the substrate 600 moves in a direction of an arrow A of FIG. 2.

In this regard, deposition is performed while the substrate 600 moves in a Y-axis direction in the chamber 101 in FIG. 2. However, the present disclosure is not limited thereto. Deposition may be performed while the substrate 600 is fixed, and the organic layer deposition assembly 100-5 moves in the Y-axis direction.

Thus, the mask sheet assembly 150 having a much smaller size than an existing FMM may be manufactured by using the organic layer deposition assembly 100-5. That is, the organic layer deposition assembly 100-5 may continuously perform deposition, i.e., by moving in a scanning manner, while the substrate 600 moves in the Y-axis direction, and thus a length of the mask sheet assembly 150 in at least one of the X-axis direction and the Y-axis direction may be much less than a length of the substrate 600.

As described above, the mask sheet assembly 150 may be much smaller than the existing FMM, and thus it is easy to manufacture the mask sheet assembly 150. That is, in all processes of the mask sheet assembly 150 such as an etching process, a subsequent fine tensile and welding process, a transfer and washing process, etc. the mask sheet assembly 150 having a small size may be advantageous compared to a FMM deposition method. The mask sheet assembly 150 having a small size may be further advantageous as the organic light-emitting display device becomes larger.

As described above, in order to perform deposition while the organic layer deposition assembly 100-5 and the substrate 600 move relatively with respect to each other, the organic layer deposition assembly 100-5 and the substrate 600 may be spaced apart from each other. This will be described in detail later.

The deposition source 110 receiving and heating the deposition material 115 may be arranged at a side opposite to the substrate 600 in the chamber 101. As the deposition material 115 received in the deposition source 110 is evaporated, deposition may be performed over the substrate 600.

More specifically, the deposition source 110 may include a crucible 111 filled with the deposition material 115 therein and a heater 112 for heating the crucible 111 and evaporating the deposition material 115 filling the crucible 111 toward one side of the crucible 111, specifically, toward the deposition source nozzle 120.

The deposition source nozzle 120 may be arranged at one side of the deposition source 110, specifically, at a side that faces the substrate 600 in the deposition source 110. In this regard, in the organic layer deposition assembly 100-5, deposition source nozzles 121 may be formed differently from each other when a common layer and a pattern layer are deposited.

The mask sheet assembly 150 may be further provided between the deposition source 110 and the substrate 600. The above-described mask sheet assembly 150 will be described in detail below.

The deposition material 115 evaporated in the deposition source 110 may pass through the deposition source nozzle 120 and the mask sheet assembly 150 and face toward the substrate 600 that is a deposition target. In this regard, the mask sheet assembly 150 may be manufactured through etching that is the same method as an existing method of manufacturing a FMM, in particular, a stripe type mask. However, the present disclosure is not limited thereto. The mask sheet assembly 150 may be manufactured by using an electro-forming method, a laser patterning method, or the like.

In this regard, the above-described deposition source 110, the deposition source nozzle 120 coupled to the deposition source 110, and the mask sheet assembly 150 may be spaced apart from each other.

As described above, the deposition may be performed in the organic layer deposition assembly 100-5 while moving relatively with respect to the substrate 600. In order for the organic layer deposition assembly 100-5 to move relatively with respect to the substrate 600, the mask sheet assembly 150 may be spaced apart from the substrate 600 by a predetermined distance.

More specifically, an existing FMM deposition method performs a deposition process by bringing a mask into close contact with a substrate in order to prevent a shadow from being formed over the substrate. However, when the mask comes into close contact with the substrate as described above, defects occur due to the contact between the substrate and the mask. Since the mask may not move with respect to the substrate, a size of the mask needs to be the same as that of the substrate. Thus, since the organic light-emitting device becomes larger, the size of the mask needs to increase, which causes a problem in that it is not easy to form such a large-sized mask.

In order to address the problem, in the organic layer deposition assembly 100-5 according to the present exemplary embodiment, the mask sheet assembly 150 may be spaced apart from the substrate 600, the deposition target, by a predetermined distance.

According to the present disclosure, deposition may be performed while the mask sheet assembly 150 moves with respect to the substrate 600, thereby obtaining an effect of easily manufacturing the mask sheet assembly 150. Since exemplary embodiments avoid mask contact with the substrate, defects caused by a contact between the substrate 600 and the mask sheet assembly 150 may be prevented. Manufacturing speed may also be increased since the time to bring the substrate 600 into close contact with the mask sheet assembly 150 during processing may be unnecessary.

A specific placement of each of configurations of the upper housing 104 will be described as follows.

The above-described deposition source 110 and deposition source nozzle 120 may be arranged over a bottom portion of the upper housing 104. A seating unit 104-1 may protrude from both sides of the deposition source 110 and the deposition source nozzle units 120. The mask sheet assembly 150, the first stage 160, and the second stage 170 may be sequentially arranged over the seating unit 104-1.

In this regard, the first stage 160 may be configured to move in the X-axis direction and the Y-axis direction and may function to align the mask sheet assembly 150 in the X-axis direction and the Y-axis direction. That is, the first stage 160 may include a plurality of actuators and may move in the X-axis direction and the Y-axis direction with respect to the upper housing 104.

The second stage 170 may be configured to move in a Z-axis direction and may function to align the mask sheet assembly 150 in the Z-axis direction. That is, the second stage 170 may include a plurality of actuators and may move in the Z-axis direction with respect to the first stage 160.

The mask sheet assembly 150 may be arranged over the second stage 170. As described above, the mask sheet assembly 150 is arranged over the first and second stages 160 and 170 such that the mask sheet assembly 150 is configured to move in the X-axis direction, the Y-axis-direction, and the Z-axis direction, and thus the substrate 600 and the mask sheet assembly 150 may be aligned.

Furthermore, the upper housing 104, the first stage 160, and the second stage 170 may simultaneously function to guide a movement path of the deposition material 115 such that the deposition material 115 sprayed through the deposition source nozzles 121 is not dispersed. That is, the movement path of the deposition material 115 may be closed by the upper housing 104, the first stage 160, and the second stage 170, and thus the upper housing 104, the movement of the deposition material 115 may simultaneously guide a movement of the deposition material 115 in the X-axis direction and the Y-axis direction.

The source shutters 140 may be further provided between the mask sheet assembly 150 and the deposition source 110. The source shutters 140 may function to block the deposition material 115 sprayed from the deposition source 110.

Although not shown in FIG. 1, 2, or 3, a blocking member (not shown) for preventing an organic material from being deposited on a non-film forming region of the substrate 600 may be further provided in the deposition unit 100. The blocking member (not shown) may be formed to move together with the substrate 600 while covering an edge portion of the substrate 600, and thus the non-film forming region of the substrate 600 may be covered, thereby obtaining an effect of conveniently preventing the organic material from being deposited on the non-film forming region of the substrate 600 without a separate structure.

In addition, although not shown in FIGS. 1, 2 and 3, source shutter drivers (not shown) for moving respectively the source shutters 140 may be further provided in the deposition unit 100. In this regard, each of the source shutter drivers may include a general motor and a gear assembly and may include a cylinder or the like that linearly moves in one direction. However, the above-described source shutter drivers are not limited thereto and may include all of devices that linearly move each of the source shutters 140.

The transfer unit 400 for transferring the substrate 600 that is a deposition target will be described in detail below. Referring to FIGS. 2 and 3, the transfer unit 400 may include the first transfer unit 410, the second transfer unit 420, and the moving unit 430.

In order to deposit an organic layer over the substrate 600 with the organic layer deposition assembly 100-5, the first transfer unit 410 may function to, in-line, transfer the moving unit 430 including a carrier 431 and an electrostatic chuck 432 coupled to the carrier 431 and the substrate 600 attached to the moving unit 430.

The second transfer unit 420 may function to retransfer, to the loading unit 200, the moving unit 430 from which the substrate 600 is separated in the unloading unit 300 after deposition is performed once while the substrate 600 passes through the deposition unit 100. The above-described second transfer unit 420 may include a coil 421, a roller guide 422, and a charging track 423.

The moving unit 430 may include the carrier 431 that is transferred along with the first and second transfer units 410 and 420 and the electrostatic chuck 432 coupled over one surface of the carrier 431 and to which the substrate 600 is attached.

Each of configurations of the transfer unit 400 will be described in more detail below.

The carrier 431 of the moving unit 430 will be described in detail.

The carrier 431 may include a body portion 431a, a linear motion system (LMS) magnet, a contactless power supply (CPS) module 431c, a power supply 431d, and guide grooves (not shown).

The body portion 431a may constitute a base portion of the carrier 431 and may include a magnetic material such as iron. The carrier 431 may be maintained to be spaced apart from a guider 412 by a predetermined distance according to a magnetic force between the body portion 431a of the carrier 431 and a magnetic levitation bearing (not shown).

The guide grooves (not shown) may be formed at both side surfaces of the body portion 431a. A guide protrusion (not shown) of the guider 412 may be accommodated in each of the guide grooves.

A magnetic rail 431b may be arranged along a centerline of a travel direction of the body portion 431a. A linear motor may be configured by combining the magnetic rail 431b of the body portion 431a and a coil 421 with each other and may transfer the carrier 431 in the direction of the arrow A.

The CPS module 431c and the power supply 431d may be disposed at one side of the magnetic rail 431b in the body portion 431a. The power supply 431d may be a kind of a rechargeable battery for supplying electric power such that the electrostatic chuck 432 uses the electric power to clamp the substrate 600 and maintains the state of clamping the electrostatic chuck 432 to the substrate 600. The CPS module 431c may be a wireless charging module for charging the power supply 431d.

More specifically, the charging track 423 arranged in the second transfer unit 420 may be connected to an inverter (not shown) and may supply electric power to the CPS module 431c when the carrier 431 is transferred in the second transfer unit 420, and a magnetic field is generated between the charging track 423 and the CPS module 431c. The electric power supplied to the CPS module 431c may charge the power supply 431d.

In the electrostatic chuck 432, an electrode to which electric power is applied may be located in a body including ceramic, and the substrate 600 may be attached to a surface of the body by applying a high voltage to the electrode.

Driving of the moving unit 430 will be described in detail.

A driver may be configured by combining the magnetic rail 431b of the body portion 431a and the coil 421. In this regard, the driver may be a linear motor. The linear motor may be a device having a very high positioning degree owing to a small friction coefficient and a very low occurrence of errors compared to an existing slide guide system. As described above, the linear motor may include the coil 421 and the magnetic rail 431b. The magnetic rail 431b may be arranged in a line over the carrier 431. A plurality of coils 421 may be spaced apart from each other by a predetermined distance at one side in the chamber 101 so as to respectively face the magnetic rails 431b.

As described above, the magnetic rails 431b rather than the coils 421 may be arranged over the carrier 431 that is a moving object, and thus it may be possible to drive the carrier 431 although electric power is not applied to the carrier 431. In this regard, the coils 421 may be installed in an atmosphere (ATM) box in an atmospheric condition. The magnetic rails 431b may be attached to the carrier 431 such that the carrier 431 travels in the chamber 101 that maintains vacuum.

The organic layer deposition assembly 100-5 of the organic layer deposition device 10 may further include a camera 180 for aligning. More specifically, the camera 180 may align marks formed over the frame sheet assembly 150 and marks formed over the substrate 600 in real time. In this regard, the camera 180 may be provided so as to secure a clear view in the vacuum chamber 101 in which deposition is performed. To this end, the camera 180 may be installed in a camera accommodator 181 in an atmospheric condition.

The frame sheet assembly 150 will be described in detail with reference to FIGS. 4, 5, 6, 7, 8, 9, and 10 below.

Figure 5:
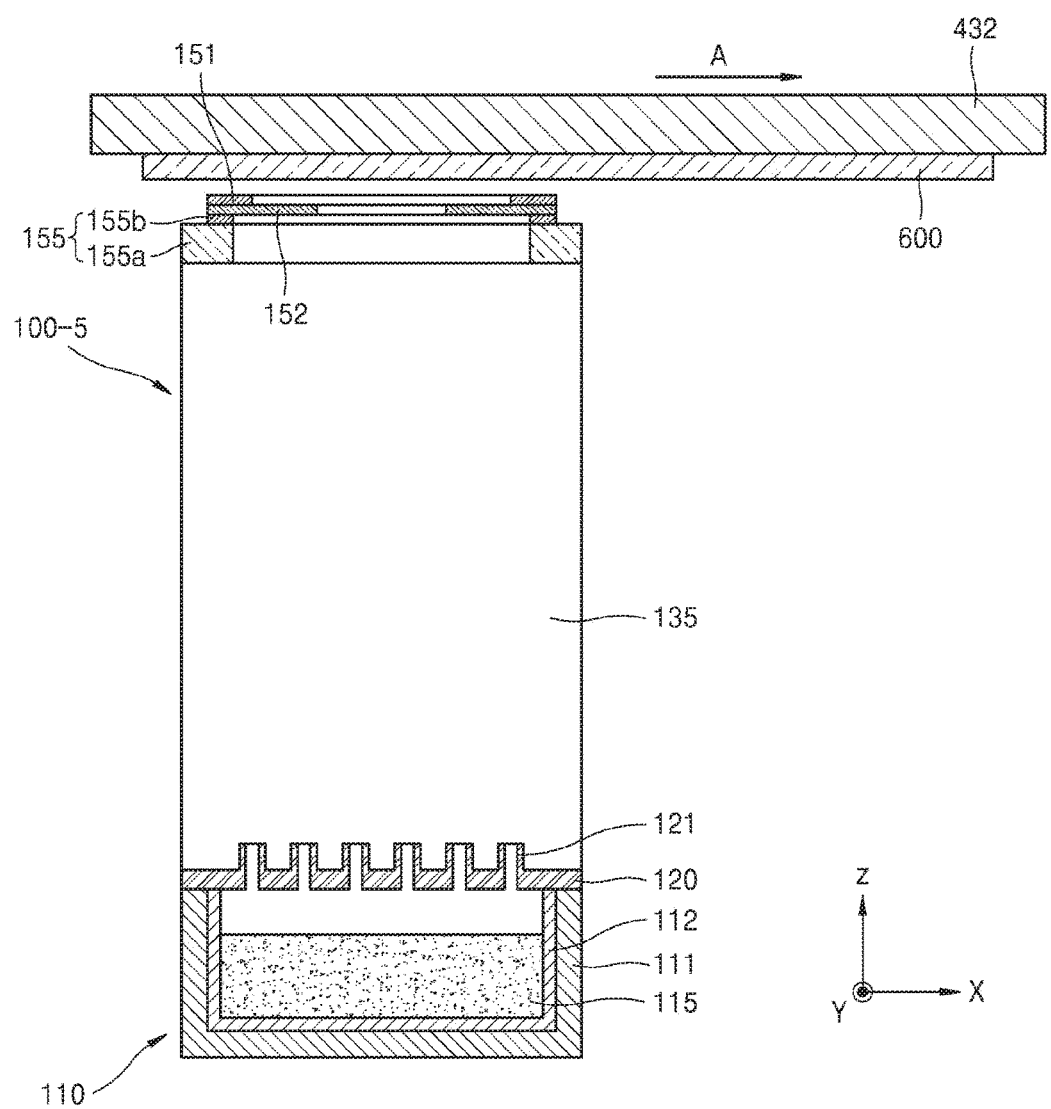
FIG. 5 is a lateral cross-sectional view of the organic layer deposition assembly of FIG. 4.
Figure 6:
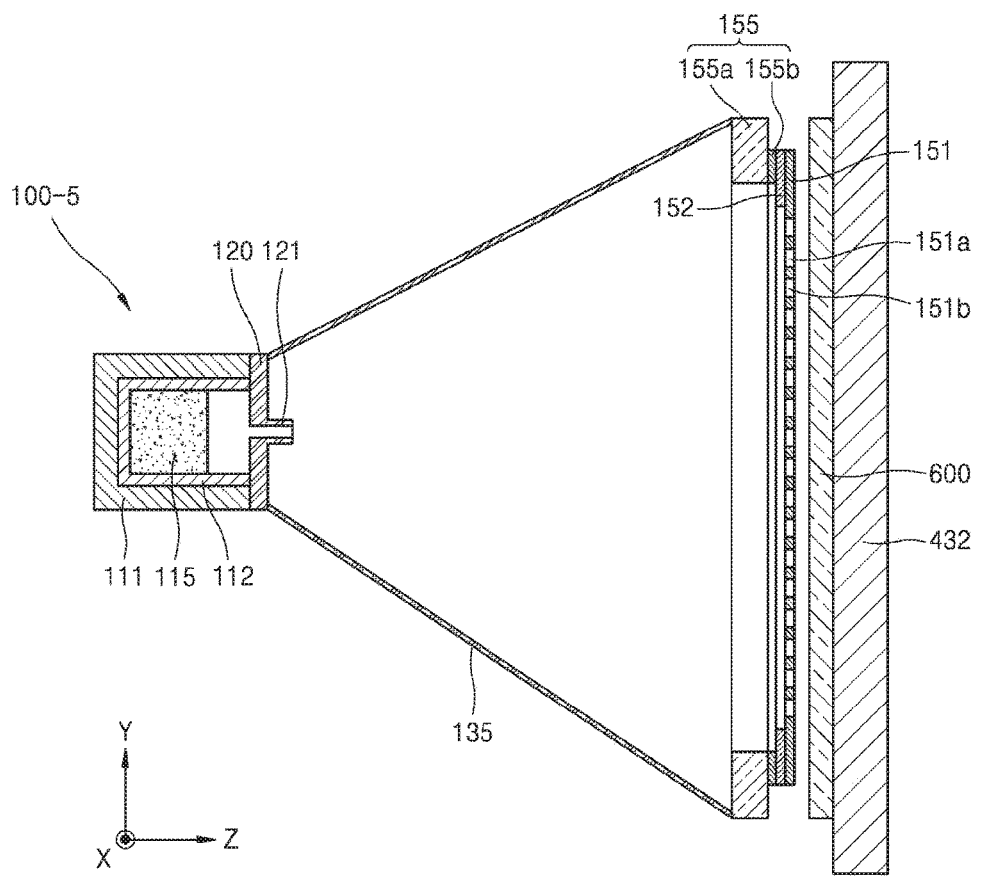
FIG. 6 is a plan cross-sectional view of the organic layer deposition assembly of FIG. 4.

FIG. 4 is a schematic perspective view of the organic layer deposition assembly 100-5 according to an exemplary embodiment. FIG. 5 is a lateral cross-sectional view of the organic layer deposition assembly 100-5 of FIG. 4. FIG. 6 is a plan cross-sectional view of the organic layer deposition assembly 100-5 of FIG. 4.

Referring to FIGS. 4, 5, and 6, the organic layer deposition assembly 100-5 according to an exemplary embodiment may include the deposition source 110, the deposition source nozzle 120, and the frame sheet assembly 150.

The deposition source 110 and the deposition source nozzle 120 were described in detail above, and thus the frame sheet assembly 150 will be described in detail below.

As described above, the frame sheet assembly 150 may be disposed between the deposition source 110 and the substrate 600. The frame sheet assembly 150 may include a patterning slit sheet 151, a correction sheet 152, and a frame 155.

The frame 155 may have a polygonal shape. The correction sheet 152 and the patterning slit sheet 151 may be sequentially stacked over and combined with the frame 155. In more detail, the frame 155 may include a body portion 155a and a bonding portion 155b. The bonding portion 155b may protrude from the body portion 155a. The bonding portion 155b of the frame 155 may be bonded to the correction sheet 152 via welding. The patterning slit sheet 151 may also be to the correction sheet 152 via welding. In this regard, the patterning slit sheet 151 and the correction sheet 152 will be described in more detail with reference to FIGS. 7, 8, 9, and 10.

The above-described deposition source 110 and the deposition source nozzle 120 and the frame sheet assembly 150 coupled to the deposition source 110 may be spaced apart from each other by a predetermined distance and connected to each other through a connection member 135. That is, the deposition source 110, the deposition source nozzle 120, and the frame sheet assembly 150 may be connected to each other through the connection member 135 and may be integrally formed with each other.

In this regard, the connection member 135 may guide a movement path of the deposition material 115 such that the deposition material 115 sprayed through the deposition source nozzles 121 is not dispersed. Although the connection members 135 are formed only in left and right directions of the deposition source 110, the deposition source nozzle 120, and the frame sheet assembly 150 and guide the deposition material 115 in a Y-axis direction (as shown in FIG. 4), this is for convenience of illustration and the present disclosure is not limited thereto. The connection member 135 may have a closed box shape and may simultaneously guide a movement of the deposition material 115 in an X-axis direction and in the Y-axis direction.

Figure 7:
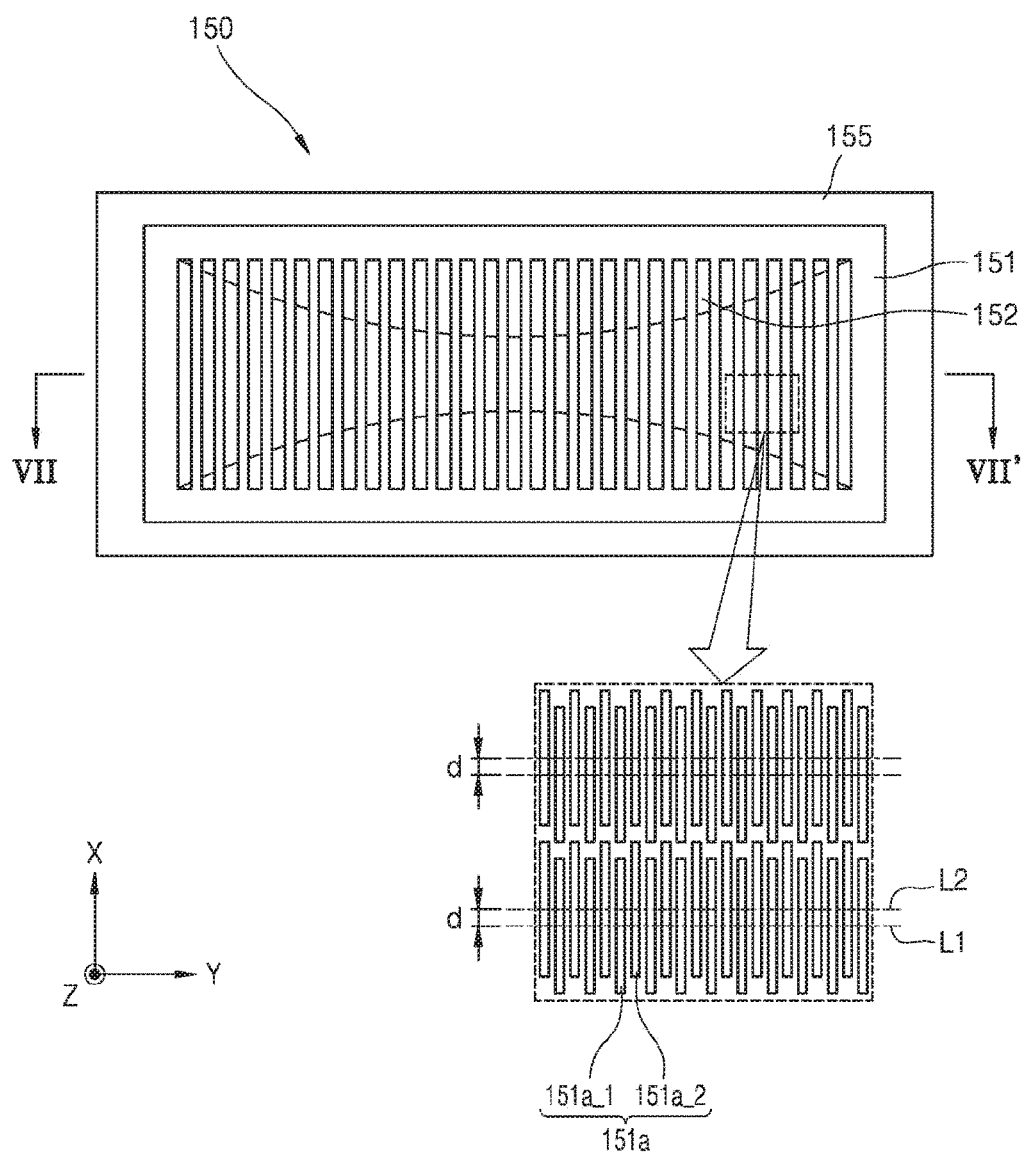
FIG. 7 is a schematic plan view of a frame sheet assembly of FIG. 4.
Figure 8:
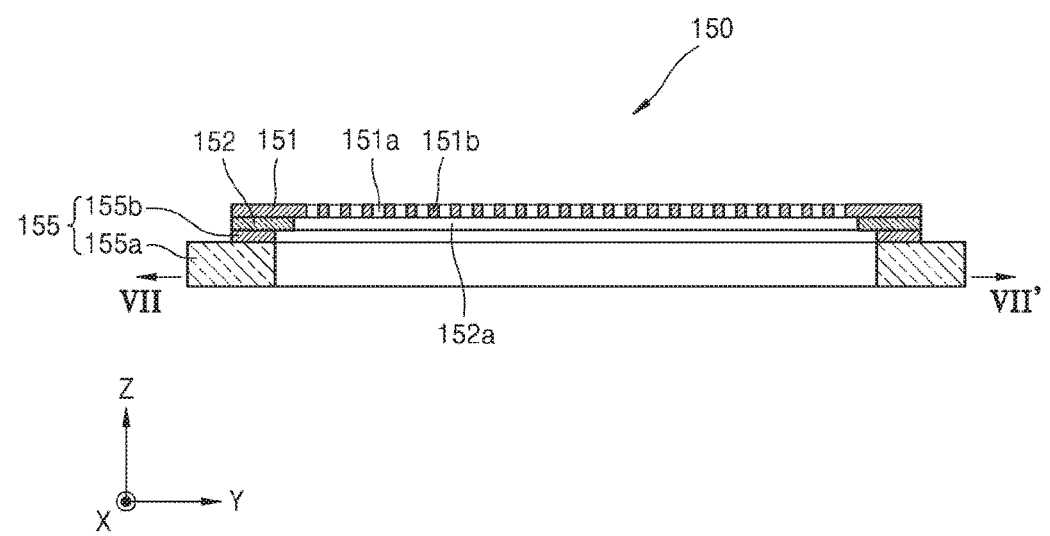
FIG. 8 is a lateral cross-sectional view of the frame sheet assembly of FIG. 7 taken along a cut line VII-VII'.
Figure 9:
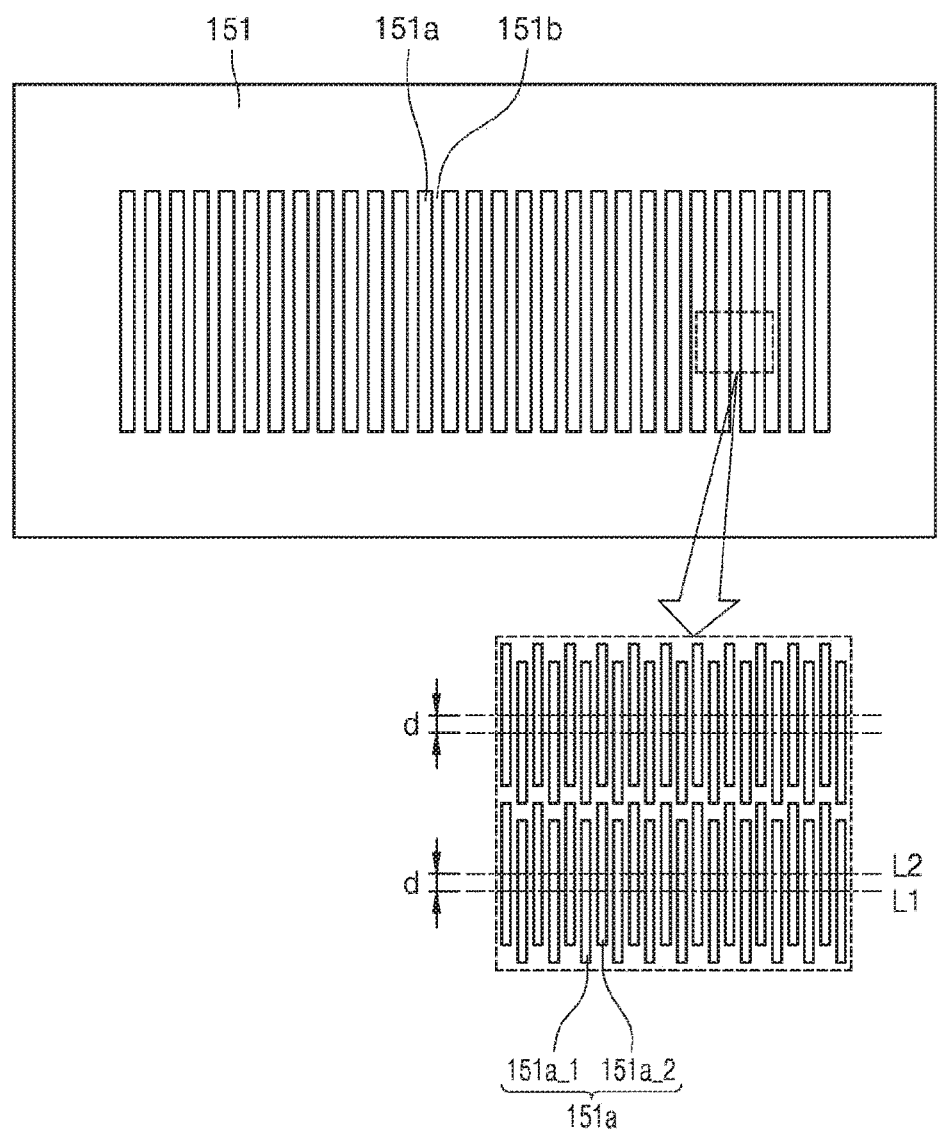
FIG. 9 is a schematic plan view of a patterning slit sheet of FIG. 7.

FIG. 7 is a schematic plan view of the frame sheet assembly 150 of FIG. 4. FIG. 8 is a lateral cross-sectional view of the frame sheet assembly 150 of FIG. 7 taken along a cut line VII-VII'. FIG. 9 is a schematic plan view of the patterning slit sheet 151 of FIG. 7.

Referring to FIGS. 7, 8, and 9, the patterning slit sheet 151 may include a patterning slit 151a and a patterning bar 151b. The patterning slit 151a may be a region penetrating from an upper surface of the patterning slit sheet 151 to a lower surface thereof. The patterning bar 151b may be a blocking region disposed between patterning slits 151a that are adjacent to each other. That is, the deposition material 115 evaporated in the deposition source 110 may be blocked by the patterning bar 151b or may pass through the patterning slit 151a and may be deposited on the substrate 600 that is a deposition target.

In more detail, the patterning slit 151 may include a plurality of first patterning slits 151a_1 and a plurality of second patterning slits 151a_2. The plurality of first patterning slits 151a_1 and the plurality of second patterning slits 151a_2 may be alternately arranged in a first direction (X-axis direction) or in a second direction (Y-axis direction).

In this regard, a line L1 passing through a center of the first patterning slit 151a_1 in the second direction and a line L2 passing through a center of the second patterning slit 151a_2 in the second direction may be spaced apart from each other by a predetermined distance d. That is, the first patterning slit 151a_1 and the second patterning slit 151a_2 may be arranged in a zigzag in the second direction.

In a case where patterning slits (not shown) having the same length, other than the first patterning slit 151a_1 and the second patterning slit 151a_2, are continuously arranged in the first direction and in the second direction, a difference between some regions of each of the patterning slits blocked by the correction sheet 152 may occur.

That is, the deposition material 115 of a relatively small amount may pass through a patterning slit of a relatively large region blocked by the correction sheet 152, whereas the deposition material 115 of a relatively great amount may pass through a patterning slit of a relatively small region blocked by the correction sheet 152.

Thus, in the case where the patterning slits have the same length, an amount of the deposition material 115 passing through each of the patterning slits may be different. This means that a film thickness of the deposition material 115 deposited on the substrate 600 is not uniform. If the deposition material 115 is not uniformly deposited, the quality and reliability of a display product may deteriorate.

However, due to an arrangement of the first patterning slit 151a_1 and the second patterning slit 151a_2 having the configuration according to an exemplary embodiment, a thickness of the deposition material 115 deposited on the substrate 600 through the patterning slit 151a adjacent to the correction sheet 152 may be uniformly deposited and the occurrence of a brightness difference between regions of a display device may be further prevented.

The correction sheet 152 may be coupled with the frame 155. The patterning slit sheet 151 may be coupled onto the correction sheet 152. The correction sheet 152 may partially cover the patterning slit 151a and correct an amount of the deposition material 115 passing through the patterning slit 151a such that the deposition material 115 of the same amount passes through a center portion (see C in FIG. 10) of the patterning slit 151a arranged at a relatively close to the deposition source nozzle 121 and an edge region of the patterning slit 151a arranged at a relatively far from the deposition source nozzle 121. The correction sheet 152 will be described in detail with reference to FIG. 10 below.

Figure 10:
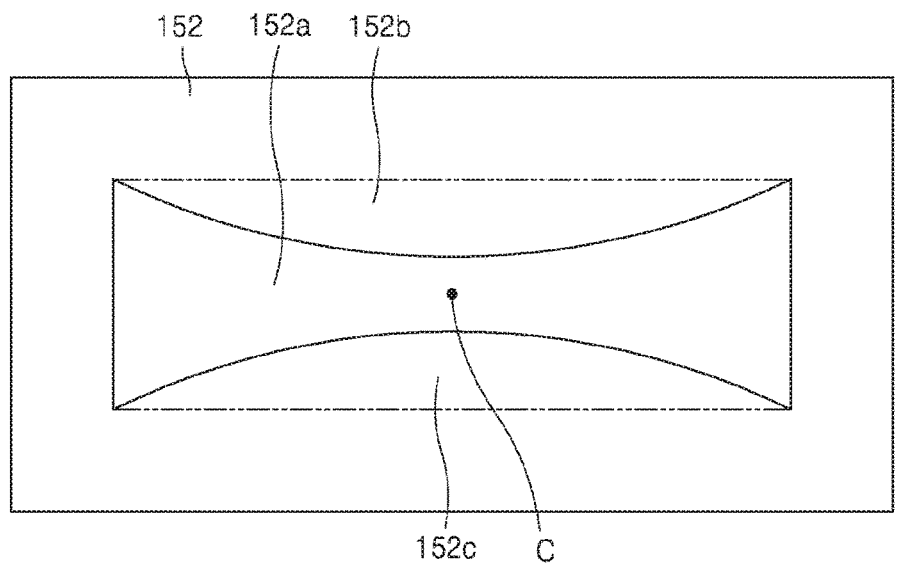
FIG. 10 is a schematic plan view of a correction sheet of FIG. 7.

FIG. 10 is a schematic plan view of the correction sheet 152 of FIGS. 7 and 8. Referring to FIG. 10, the correction sheet 152 may include a through hole 152a and blocking parts 152b and 152c. The through hole 152a may be a region passing through an upper surface of the correction sheet 152 and a lower surface thereof. The blocking parts 152b and 152c may bulge in a length direction of the patterning slit 151a toward the center portion C of the through hole 152a.

In more detail, the blocking parts 152b and 152c may include a first member 152b and a second member 152c. The first member 152b may bulge and downwardly extend toward the center portion C of the through hole 152a. The second member 152c may bulge and upwardly extend toward the center portion C of the through hole 152a. The through hole 152a formed by the blocking parts 152b and 152c may be similar to a cross-section of a concave lens. The first member 152b and the second member 152c may be symmetrical to each other with respect to the center portion C of the through hole 152a.

The patterning slit sheet 151 may be arranged over the correction sheet 152, and thus upper and lower portions of the patterning slit 151a may be partially hidden by the blocking parts 152b and 152c of the correction sheet 152. Thus, as shown in FIG. 7, the farther from a center of the patterning slit sheet 151, the longer the length of the patterning slit 151a exposed by the through hole 152a. That is, a length of the patterning slit 151a of a center portion of the patterning slit sheet 151 that is exposed by the through hole 152a may be smaller than that of the patterning slit 151a of both ends of the patterning slit sheet 151.

In the organic layer deposition assembly 100-5 according to an exemplary embodiment, the deposition source nozzle 121 may be arranged in a length direction (in an X-axis direction) of the patterning slit 151a, and thus when the correction sheet 152 is not present, the deposition material 115 of the greatest amount may be deposited on a center portion of the substrate 600, thereby reducing a deposition uniformity.

However, as described above, the patterning slit 151a in a center portion of the patterning slit sheet 151 may be hidden by the blocking parts 152b and 152c of the correction sheet 152 relatively more than the patterning bar 151b of both ends of the patterning slit sheet 151, and accordingly, an amount of the deposition material 115 passing through the patterning slit 151a of the center portion of the patterning slit sheet 151 may be reduced. Thus, a thickness of a deposition layer deposited on the substrate 600 may be uniform.

That is, since a deposition layer deposited by an organic layer deposition device may have a bulging portion in a center thereof, a part of a deposition material moving toward the center of the deposition layer needs to be blocked in order to make the bulging portion uniform. Thus, the correction sheet 152 may be arranged below the patterning slit sheet 151 to block a part of the deposition material 115. In this regard, since the blocking parts 152*b* and 152*c* of the correction sheet 152 bulgingly protrude toward the center portion C of the through hole 152*a*, a greater amount of the deposition material 115 may collide with the blocking parts 152*b* and 152*c* and thus may be blocked from reaching the bulging portion, and a smaller amount of the deposition material 115 may collide with the blocking parts 152*b* and 152*c* and thus may be blocked from reaching an edge portion of the deposition layer. In this case, the correction sheet 152 may be formed such that a smallest film thickness, in general, a film thickness of both ends of the patterning slit sheet 151, is an entire film thickness.

As described above, the correction sheet 152 may be arranged in a movement path of the deposition material 115, and thus, a thickness of the deposition film deposited by the organic layer deposition device may be corrected. That is, a part in which a great amount of the deposition material 115 is deposited may not receive a great amount of the deposition material 115 by increasing heights of the blocking parts 152*b* and 152*c* of the correction sheet 152 and a part in which a small amount of the deposition material 115 is deposited may not receive a small amount of the deposition material 115 by decreasing heights of the blocking parts 152*b* and 152*c* of the correction sheet 152. Thus, a deposition amount may be corrected in order to achieve a uniform thickness of the deposition material 115. An organic layer deposited on a substrate according to exemplary embodiments may be uniformly formed with a uniformity error in a range from 1% to 2%. Thus, the quality and reliability of products may increase.

The patterning slit sheet 151 may droop toward the deposition source 110 due to gravity as a size thereof increases. However, according to an exemplary embodiment, the correction sheet 152 is arranged over a lower surface of the patterning slit sheet 151, thereby supporting the patterning slit sheet 151 and reducing drooping of the patterning slit sheet 151.

Figure 11:
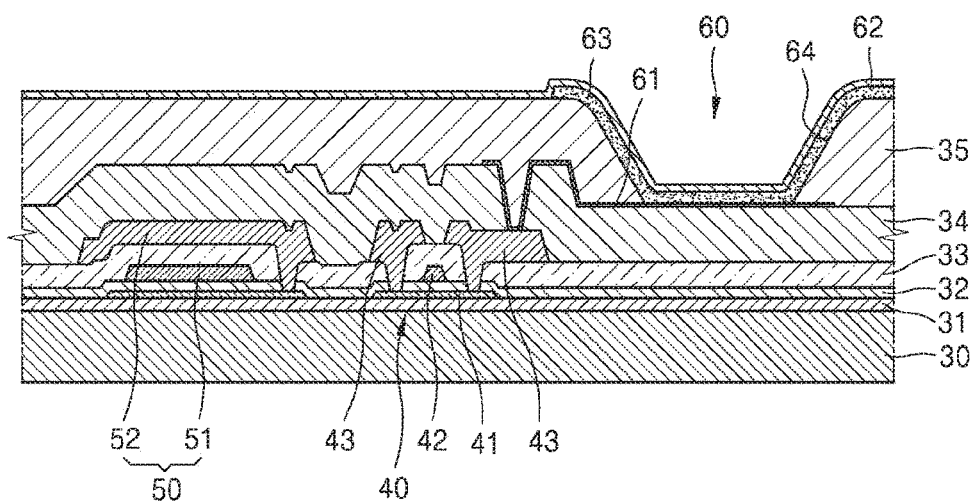
FIG. 11 is a cross-sectional view of an organic light-emitting display device manufactured as an organic layer deposition device according to the present disclosure.

FIG. 11 is a cross-sectional view of an organic light-emitting display device manufactured as an organic layer deposition device according to the present disclosure.

Referring to FIG. 11, an active matrix type organic light-emitting display device may be formed over a substrate 30. The substrate 30 may include a transparent material, for example, a glass material, a plastic material, or a metallic material. An insulating layer 31, such as a buffer layer, may be formed over an entire surface of the substrate 30.

A thin film transistor (TFT) 40, a capacitor 50, and an organic light-emitting diode (OLED) 60 may be arranged over the insulating layer 31 as shown in FIG. 11.

A semiconductor active layer 41 may be formed on an upper surface of the insulating layer 31 in a predetermined pattern. The semiconductor active layer 41 may be covered by a gate insulating layer 32. The semiconductor active layer 41 may include a p-type or n-type semiconductor material.

A first capacitor electrode 51 of the capacitor 50 may be formed on an upper surface of the gate insulating layer 32. A gate electrode 42 of the TFT 40 may be formed corresponding to the semiconductor active layer 41. An interlayer insulating layer 33 may be formed to cover the first capacitor electrode 51 and the gate electrode 42. The semiconductor active layer 41 may be partially exposed by a contact hole formed by etching the gate insulating layer 32 and the interlayer insulating layer 33 through an etching process such as dry etching after the interlayer insulating layer 33 is formed.

Thereafter, a second capacitor electrode 52 and a source/drain electrode 43 may be formed over the interlayer insulating layer 33. The source/drain electrode 43 may be formed to contact the semiconductor active layer 41 exposed through the contact hole. A protection layer 34 may be formed to cover the second capacitor electrode 52 and the source/drain electrode 43 and expose a part of the drain electrode 43 through the etching process. An insulating layer may be further formed over the protection layer 34 so as to planarize the protection layer 34.

The OLED 60 may display predetermined image information by emitting red, green, or blue light according to a flow of current. A first electrode 61 may be formed over the protection layer 34. The first electrode 61 may be electrically connected to the drain electrode 43 of the TFT 40.

A pixel-defining layer 35 may be formed to cover the first electrode 61. An opening 64 may be formed in the pixel-defining layer 35 and then an organic emission layer 63 may be formed in a region defined by the opening 64. A second electrode 62 may be formed over the organic emission layer 63.

The pixel-defining layer 35 may define individual pixels, include an organic material, and planarize a surface of the substrate in which the first electrode 61 is formed, in particular, a surface of the protection layer 34.

The first electrode 61 and the second electrode 62 may be insulated from each other and apply voltages of opposite polarities to the organic emission layer 63 to allow the organic emission layer 63 to emit light.

The organic emission layer 63 may include a low-molecular weight organic material or a high-molecular weight organic material. When the organic emission layer 63 includes the low-molecular weight organic material, the organic emission layer 63 may have a single or multi-layer structure including a hole injection layer (HIL), a hole transport layer (HTL), the EML, an electron transport layer (ETL), and/or an electron injection layer (EIL). Examples of available organic materials may include copper phthalocyanine (CuPc), N,N'-di(naphthalene-1-yl)-N,N'-diphenyl-benzidine (NPB), and tris-8-hydroxyquinoline aluminum (Alq$_3$). The organic emission layer 63 including these low-molecular weight organic materials may be formed by using the organic layer deposition assembly 100 of FIGS. 1, 2, and 3 through a vacuum deposition method.

After the opening 64 is formed in the pixel-defining layer 35, the substrate 30 may be transferred into a unit 100 as shown in FIG. 1. A target organic material may be contained in a first deposition source 11 and a second deposition source 12 and then deposited. In this regard, when a host and a dopant are simultaneously deposited, a host material and a dopant material may be respectively contained in the first deposition source 11 and the second deposition source 12 and then deposited.

After the organic emission layer 63 is formed, the second electrode 62 may also be formed through the same deposition process as used in the organic emission layer 63.

The first electrode 61 may function as an anode, and the second electrode 62 may function as a cathode. Polarities of the first electrode 61 and the second electrode 62 may be switched. The first electrode 61 may be patterned to correspond to a region of each pixel. The second electrode 62 may be formed to cover all pixels.

The first electrode 61 may be formed as a transparent electrode or a reflective electrode. When the first electrode 61 is formed as the transparent electrode, the transparent electrode may include indium tin oxide (ITO), indium zinc oxide (IZO), zinc oxide (ZnO), or indium oxide ($In_2O_3$). When the first electrode 61 is formed as the reflective electrode, the reflective electrode may be formed by forming a reflective layer including silver (Ag), magnesium (Mg), aluminum (Al), platinum (Pt), palladium (Pd), gold (Au), nickel (Ni), neodymium (Nd), iridium (Ir), chromium (Cr) or a compound thereof and forming a transparent layer including ITO, IZO, ZnO, or $In_2O_3$ on the reflective layer. The first electrode 61 may be formed by forming a layer by sputtering, etc. and then patterning the layer by photolithography, etc.

The second electrode 62 may also be formed as a transparent electrode or a reflective electrode. When the second electrode 62 is formed as the transparent electrode, since the second electrode 62 may be used as a cathode, the transparent electrode may be formed by depositing a metal having a low work function, such as lithium (Li), calcium (Ca), lithium fluoride/calcium (LiF/Ca), lithium fluoride/aluminum (LiF/Al), aluminum (Al), silver (Ag), magnesium (Mg), or a compound thereof in a direction of the organic emission layer 63 and forming an auxiliary electrode layer or a bus electrode line including ITO, IZO, ZnO, $In_2O_3$, or etc. thereon. When the second electrode 62 is formed as the reflective electrode, the reflective layer may be formed by entirely depositing Li, Ca, LiF/Ca, LiF/Al, Al, Ag, Mg, or a compound thereof. The second electrode 62 may be formed by using the same deposition method used in the organic emission layer 63 described above.

The organic layer deposition device according to the present invention may be applied to deposit an organic layer or an inorganic layer of an organic TFT and to form layers including various materials.

According to the exemplary embodiments of the disclosure described above, an organic layer having a uniform thickness may be deposited on a display substrate, thereby preventing the occurrence of a brightness difference.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing an organic light emitting display device including an organic layer deposition assembly for depositing an organic layer on a substrate, the method comprising:

fixing the substrate to a moving unit, wherein the fixing is performed by a loading unit;

transferring the moving unit to which the substrate is fixed to a chamber via a first transfer unit installed to penetrate the chamber;

forming the organic layer by depositing a deposition material sprayed from the organic layer deposition assembly on the substrate while the substrate relatively moves with respect to the organic layer deposition assembly in a state wherein an organic layer deposition assembly and the substrate that are arranged in the chamber are spaced apart from each other by a predetermined degree;

separating the substrate from which deposition is completed from the moving unit, the separating is performed by an unloading unit; and transferring the moving unit separated from the substrate to the loading unit via a second transfer unit installed to penetrate the chamber, wherein the organic layer deposition assembly comprises:

a deposition source configured to spray the deposition material;

a deposition source nozzle arranged in one side of the deposition source and including deposition source nozzles arranged in a first direction;

a patterning slit sheet arranged to face the deposition source nozzle and including patterning slits in a second direction that crosses the first direction; and a correction sheet arranged between the deposition source nozzle and the patterning slit sheet and configured to block at least a part of the deposition material sprayed from the deposition source;

wherein the organic layer deposition assembly is configured to perform deposition while the substrate moves in the first direction with respect to the organic layer deposition assembly, wherein the patterning slits comprise a first patterning slit and a second patterning slit spaced apart from each other by a predetermined distance in the first direction and in the second direction, wherein a line crossing a center of the first patterning slit in the second direction and a line crossing a center of the second patterning slit in the second direction are spaced apart from each other by a predetermined distance, and wherein a line connecting the center of each adjacent patterning slit in the second direction is a single zigzag pattern.

2. The method of claim 1, wherein a plurality of organic layer deposition assemblies are provided in the chamber, each of the plurality of organic layer deposition assemblies being configured to continuously perform deposition on the substrate.

3. The method of claim 2, wherein the moving unit is configured to move cyclically between the first transfer unit and the second transfer unit.

4. The method of claim 2, wherein the first transfer unit and the second transfer unit are vertically arranged in parallel to each other.

5. The method of claim 2, wherein the second transfer unit is configured to sequentially move the moving unit to the unloading unit and the loading unit.

* * * * *